(12) United States Patent
Bisanti et al.

(10) Patent No.: US 7,355,483 B2
(45) Date of Patent: Apr. 8, 2008

(54) SYSTEM AND METHOD FOR MITIGATING PHASE PULLING IN A MULTIPLE FREQUENCY SOURCE SYSTEM

(75) Inventors: Biagio Bisanti, Antibes (FR); Stefano Cipriani, Golfe Juan (FR); Lorenzo Carpineto, Antibes (FR); Gianni Puccio, La Gaude (FR); Eric Duvivier, Golfe Juan (FR); Francesco Coppola, Grasse (FR); Martin Alderton, San Diego, CA (US)

(73) Assignee: RF Magic, Inc., San Diego, CA (US)

( * ) Notice: Subject to any disclaimer, the term of this patent is extended or adjusted under 35 U.S.C. 154(b) by 7 days.

(21) Appl. No.: 11/461,534

(22) Filed: Aug. 1, 2006

(65) Prior Publication Data
US 2007/0200640 A1 Aug. 30, 2007

Related U.S. Application Data

(60) Provisional application No. 60/595,749, filed on Aug. 2, 2005, provisional application No. 60/595,750, filed on Aug. 2, 2005, provisional application No. 60/595,754, filed on Aug. 2, 2005.

(51) Int. Cl.
  *H03L 7/00* (2006.01)
  *H03L 7/16* (2006.01)
  *H03L 7/22* (2006.01)

(52) U.S. Cl. .............................. 331/2; 331/16; 327/145; 327/147

(58) Field of Classification Search ................ 331/1 A, 331/2, 16, 18, 25; 327/145, 147–150; 375/373–376; 455/255, 257, 259, 260
See application file for complete search history.

(56) References Cited

U.S. PATENT DOCUMENTS 5,452,290 A   9/1995   Mihm (Continued)

FOREIGN PATENT DOCUMENTS

EP   1 045 606   10/2000

(Continued)

OTHER PUBLICATIONS

Vuillod P. et al: "Clock-Skew Optimization for Peak Current Reduction," ISLPED, Proc. of the Int'l Symposium on Low Power Electronics and Design, Aug. 14, 1996, pp. 265-270.

(Continued)

*Primary Examiner*—David Mis
(74) *Attorney, Agent, or Firm*—Clifford B. Perry

(57) ABSTRACT

A method for mitigating phase pulling in multiple frequency source system includes generating a first signal, the first signal referred to as an existing signal operating at an existing frequency point, the existing signal having a predefined pulling bandwidth around the existing frequency point. A request is received to generate a prospective signal at a prospective frequency point which is within the predefined pulling bandwidth of the existing signal. The prospective frequency is removed from within the predefined pulling bandwidth, and the prospective and existing signals are generated at the corresponding frequency points.

20 Claims, 3 Drawing Sheets

U.S. PATENT DOCUMENTS

| | | | |
|---|---|---|---|
| 5,565,816 | A | 10/1996 | Coeteus |
| 5,790,613 | A * | 8/1998 | Tateishi ............... 375/376 |
| 6,275,990 | B1 | 8/2001 | Dapper et al. |
| 6,304,146 | B1 | 10/2001 | Welland |
| 2003/0006850 | A1 | 1/2003 | Lye et al. |
| 2004/0156465 | A1 | 8/2004 | Schmandt |
| 2004/0189366 | A1 | 9/2004 | Haringer et al. |

FOREIGN PATENT DOCUMENTS

| | | |
|---|---|---|
| WO | WO 99/41933 | 8/1999 |
| WO | WO 2004/000822 | 9/2004 |

OTHER PUBLICATIONS

Neves et al. "Buffered Clock Tree Synthesis with Non-Zero Clock Skew Scheduling for Increased Tolerance to Process Parameter Variations," J. of VLSI Signal Proc. Systems for Signal, vol. 16, No. 2/3, Jun. 1997 pp. 149-160.

Courtesy copy of International Search Report for PCT/IB20063/052632 dated Dec. 22, 2006.

Courtesy copy of International Search Report for PCT/IB2006/052633 dated Dec. 22, 2006.

Courtesy copy of International Search Report for PCT/IB2006/052634 dated Jan. 12, 2007.

* cited by examiner

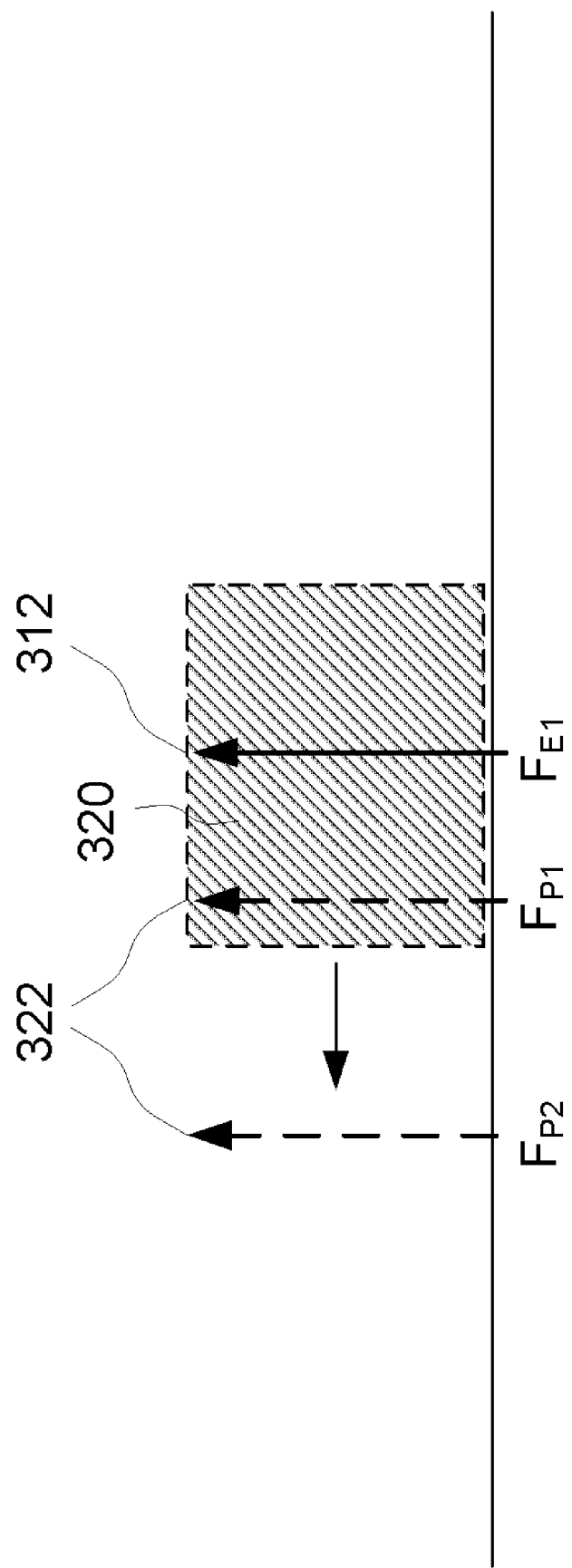

SYSTEM AND METHOD FOR MITIGATING PHASE PULLING IN A MULTIPLE FREQUENCY SOURCE SYSTEM

CROSS REFERENCE TO RELATED APPLICATIONS

This patent application is related to, and concurrently filed with each of the following patent applications, the contents of which are herein incorporated by reference for all purposes:

"Multiple Frequency Source System and Method of Operation," application Ser. No. 11/461,530; and "Offset Signal Phasing for a Multiple Frequency Source System," application Ser. No. 11/461,533.

This patent application claims priority to, and incorporates in its entirety each of the following US patent applications:

"Multiple Frequency Source System and Method of Operation," Application Ser. No. 60/595,754, filed Aug. 2, 2005;

"Offset Signal Phasing for a Multiple Frequency Source System," Application Ser. No. 60/595,749, filed Aug. 2, 2005; and "System and Method for Mitigating Phase Pulling in a Multiple Frequency Source System," Application Ser. No. 60/595,750, filed Aug. 2, 2005.

BACKGROUND

The present invention relates to tunable systems employing concurrently operable frequency sources, and in particular to systems and methods for mitigating phase pulling in said systems.

The implementation of multiple frequency sources in a system, as described in the application entitled "Multiple Frequency Source System and Method of Operation," possibly presents challenges as to how to avoid phase pulling between closely spaced, concurrently generated frequencies. In particular, the initial generation and operation of a first signal proximate in frequency to a second signal may shift the second signal off of its intended frequency, possibly degrading the system's ability to generate multiple signals at closely spaced frequencies with the required tuning precision.

What is therefore needed is a system and method for mitigating phase pulling in a system employing concurrently operable frequency sources.

SUMMARY

Systems and methods are presented herein for avoiding phase pulling in a tunable system employing concurrently operable frequency sources. In one embodiment, a method according to the present invention includes generating a first signal, the first signal referred to as an existing signal operating at an existing frequency point, the existing signal having a predefined pulling bandwidth around the existing frequency point. A request is received to generate a prospective signal at a prospective frequency point which is within the predefined pulling bandwidth of the existing signal. The prospective frequency is removed from within the predefined pulling bandwidth, and the prospective and existing signals are generated at their corresponding frequency points.

These and other features of the invention will be better understood when view in light of the following drawings and detailed description.

BRIEF DESCRIPTION OF THE DRAWINGS

FIG. 3 illustrates an exemplary embodiment of the present invention in which a prospective signal is relocated within its detection windows to provide sufficient bandwidth separation from an existing frequency signal to avoid frequency pulling in accordance with the invention.

For clarity, previously identified features retain their reference indicia in subsequent drawings.

DESCRIPTION OF EXEMPLARY EMBODIMENTS

Figure 1A:
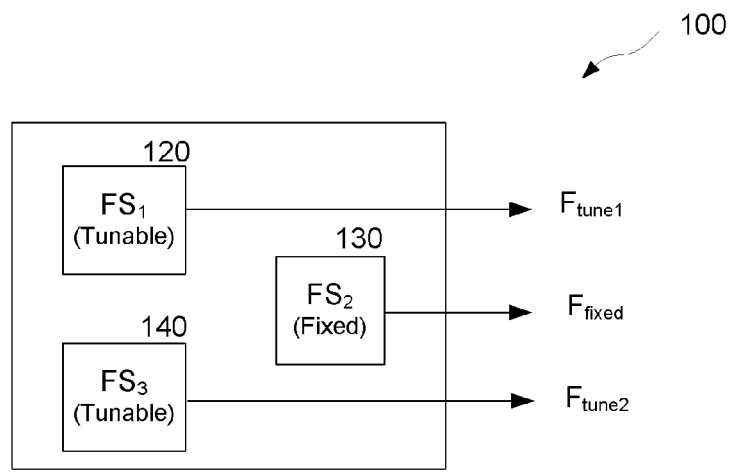
FIG. 1A illustrates an exemplary embodiment of a tunable system employing concurrently operable frequency sources in accordance with the present invention.

FIG. 1A illustrates an exemplary embodiment of a tunable system employing currently operable frequency sources in accordance with the present invention. As shown, the tunable system 100 includes three frequency sources $FS_1$ 120, $FS_2$ 130 and $FS_3$ 140, at least one of which (e.g., $FS_1$ 120) is tunable. The remaining frequency sources may be operable to generate a fixed frequency or a tunable frequency, as required or desired by the system's design.

Figure 1B:
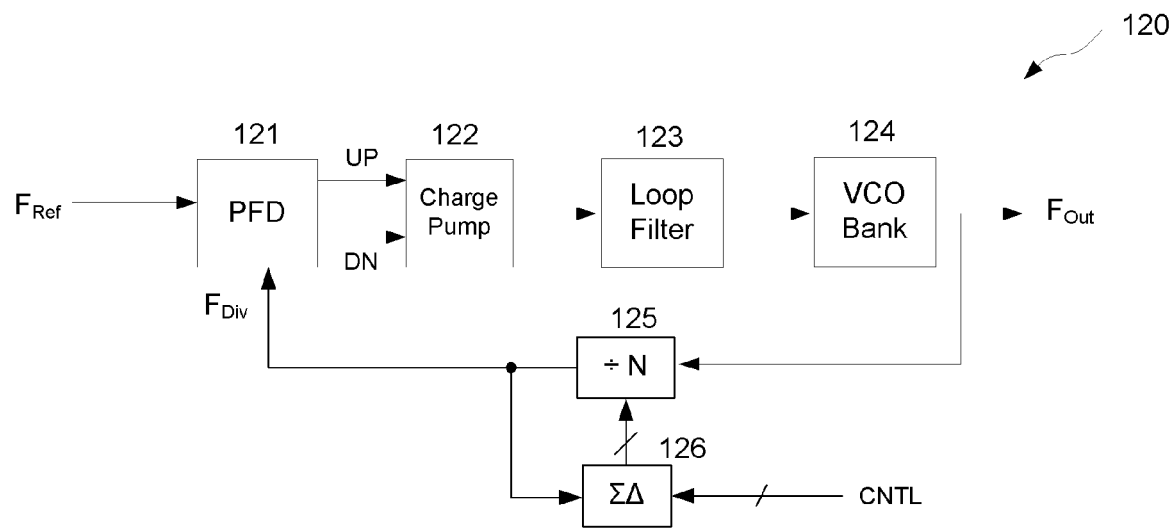
FIG. 1B illustrates an exemplary tunable frequency source in accordance with the present invention.

FIG. 1B illustrates an exemplary tunable frequency source in accordance with the present invention, the embodiment implemented as a sigma-delta phase locked loop (PLL). The PLL may be monolithically fabricated in a bipolar complementary metal oxide semiconductor (Bi-CMOS) process, although those of skill in the art will appreciate that the circuit may be formed using other processes or materials (e.g., CMOS, SiGe, GaAs) in monolithic, hybrid, or discrete form.

As illustrated, the frequency source 100 includes a phase-frequency detector 121, a charge pump circuit 122, loop filter 123, a tuning source 124 illustrated as bank of selectable VCOs, a main divide-by-N counter 125, and a programmable sigma-delta modulator 126. The sigma-delta modulator 126 receives a frequency setting control signal CNTL, and in response provides a scaling control data signal to the divide-by-N counter 125 to arrive at the desired divide ratio. The sigma-delta modulator 126 also receives the divide-by-N ($F_{Div}$) signal as a clock signal, thereby synchronizing its operation with the divide-by-N counter 125.

While the tunable frequency source $FS_1$ 120 is shown as a phase locked loop, other tunable frequency sources, such as variable oscillators, digitally controlled oscillators, and the like may be alternative employed. Fixed frequency sources may be implemented as L-C, dielectric resonator, crystal oscillators, and the like. The foregoing examples are only illustrative and those skilled in the art will appreciate that other frequency sources, both tunable and fixed, may be used in alternative embodiments of the present invention.

Figure 2:
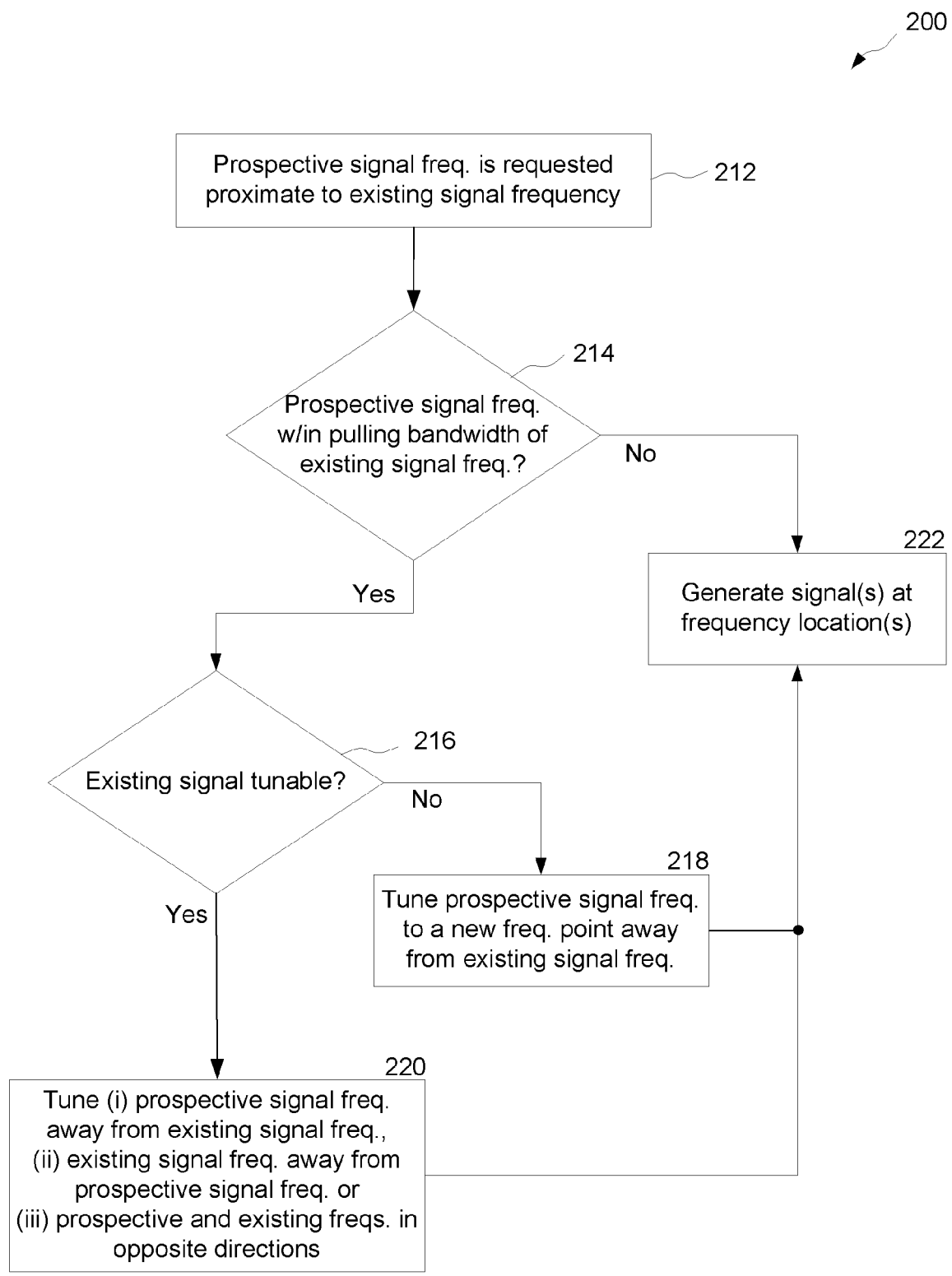
FIG. 2 illustrates an exemplary method for relocating a prospective signal and/or an existing signal to provide sufficient frequency separation to avoid phase pulling effects in accordance with the present invention.

FIG. 2 illustrates an exemplary method for relocating a prospective signal and/or an existing signal to provide sufficient frequency separation to avoid phase pulling effects in accordance with the present invention. The process begins at 212 where a prospective signal is requested having a frequency proximate to the frequency of an existing signal. At 214, a determination is made as to whether the prospective signal frequency is within the pulling bandwidth of the existing signal frequency. In an exemplary embodiment of this operation, a database structure such as that shown in FIG. 3C of Applicant's co-pending application "Multiple Frequency Source System and Method of Operation" may be accessed to determine the frequency location of the most proximate existing signal and based thereon, a determination can be made if the prospective signal frequency would be within the pulling bandwidth of the existing signal frequency.

As used herein, the term "pulling bandwidth" refers to a threshold bandwidth within which the presense of a second signal "pulls" or modulates the subject signal, such that subject signal exceeds a predefined phase noise level. The pulling bandwidth of a subject signal will depend upon the desired phase noise level as well as several factors. For example, a frequency source exhibiting a relative high quality (Q) factor will have a relatively narrow pulling bandwidth for a given phase noise requirement. Similarly, a frequency source which is highly isolated from the frequency source generating the proximate signal will have a relatively narrow pulling bandwidth for the same phase noise requirement. The Q of a frequency source will depend upon its construction and architecture; e.g., a fixed frequency crystal or dielectric resonator oscillator may exhibit a higher Q than a tunable oscillator. Isolation of the frequency source (from other frequency sources) will also depend upon the construction and architecture of the multiple source system. In the limit, a frequency source exhibiting infinite Q, or infinite isolation from a frequency source generating a proximate signal will have a phase pulling bandwidth of 0 Hz, although these conditions would be impossible to obtain, especially in a particular embodiment of the invention in which multiple tunable sources are implemented on a single integrated circuit. Accordingly, a particular operating threshold is chosen to define the predefined pulling bandwidth. Exemplary embodiments of the pulling bandwidth of a signal include bandwidths less than 500 kHz, for example 250 kHz, 100 kHz, 50 kHz, or lower, as well as bandwidths greater than 500 kHz, for example 600 kHz, 700 kHz, 800 kHz, 900 kHz, 1 MHz, or wider bandwidths.

As an example, if it is determined that the system can accept a spur level of −45 dBc @ the particular frequency offset, the isolation and Q of the frequency sources are subsequently chosen (by calculation, by experiments, or by design simulations) in order to achieve the desired limit at the offset specified by the system (LO accuracy). For example, the LO accuracy is specified to be ±1 MHz and the system is sized to give a spur at −45 dBc at 500 kHz offset from the existing signal frequency, thus the pulling bandwidth is ±500 kHz, and the specified LO accuracy allow the LO to be placed more of 500 kHz away from the existing one in order to gain some margin on the spur level.

If at 214, the prospective signal frequency is determined to be within the predefined pulling bandwidth of the existing signal frequency, a determination is made at 216 as to whether the frequency source generating the existing signal is tunable. If the existing signal frequency source cannot be tuned (either because the source is a fixed frequency source or is a tunable source, but is already tuned to the maximum or minimum point of its tunable range), the process continues at 218, at which point the prospective signal frequency is tuned to a new prospective frequency point outside of the identified pulling bandwidth. This process may be performed, for example, by using a single operation in which a frequency point outside the pulling bandwidth is identified and the prospective frequency tuned thereto. The new prospective frequency point may, for example, represent a frequency point which is the least removed from the originally-requested prospective frequency point, but which is outside the pulling bandwidth. Alternatively, the operation 216 may involve two or more tuning operations, whereby the frequency source is tuned to a first frequency point, optionally checking to determine if the first frequency point is outside of the pulling bandwidth of the existing signal, and if not, identifying a second, further removed frequency point is identified, and the frequency source tuned thereto. In such a manner, the prospective signal is progressively stepped away from the existing signal until the required bandwidth separation from the existing signal is achieved (in accordance with the LO accuracy specified by the system). Those skilled in the art will appreciate that other techniques may be used to relocate the prospective signal out of the pulling bandwidth. Subsequently at 222, the prospective signal is generated at the new prospective frequency point.

If at 216, a determination is made that the existing signal is tunable within its present range, the process continues at 220, whereby the frequency point of the prospective signal is removed from within the pulling bandwidth by means of one of three operations. Either (i) the prospective signal frequency is tuned to a new prospective signal frequency point away from the existing signal frequency and outside of the pulling bandwidth, (ii) the existing signal frequency is tuned from its present frequency point away from the prospective signal to a new existing frequency point, or (iii) a combination of (i) and (ii), whereby both the prospective and existing signal frequencies are tuned in opposite directions to respective new frequency points, each signal moved to a new frequency point such that the new prospective frequency point is located outside the pulling bandwidth of the new existing frequency point. The particular process (i)-(iii) selected in 220 may be made dependent upon the tuning capability of the source. For example, process (i) may be employed when the existing signal frequency source is located at a frequency extreme and cannot tune further away from the prospective signal, or if the existing signal is being used or performing an operation which cannot be disturbed. Process (ii) may be utilized when computations show that the prospective signal cannot be tuned any further from the existing signal. Process (iii) can be used when both frequency sources have sufficient tuning latitude, and may be employed to minimize the frequency offset needed from each signal's original tuning point in order to obtain the required frequency spacing. In a particular embodiment, the prospective and/or existing signals are tune away from the other in a non-crossing manner, as exemplified in FIG. 3 below.

Similar to the operation in 216, the operations in 222 may be performed either in a single operation or in several operations. An examplary embodiment of the former may include, e.g., computing new frequency points which provides the required bandwidth separation to place the prospective signal frequency outside of the pulling bandwidth, and the prospective and existing frequencies generated at there respective frequency points. Alternatively in the latter approach, an iterative process may be performed, whereby one or both signals are gradually stepped away from each other, and optionally the resulting bandwidth separation checked to determine if the necessary bandwidth separation has been obtained to place the prospective signal outside of the pulling bandwidth. In embodiments in which the existing frequency signal is tuned, its frequency source may either be tuned from its original frequency point while continuing to generate the existing signal, or the existing signal may be deactivated, the frequency source configured to tune to the next existing frequency point, and the existing signal generated at that new frequency point. Employing a gradual tuning approach for a continuously-operating existing signal provides advantages, in that the generation of a large frequency overshoot effect which could accompany a larger tuning step is avoided.

FIG. 3 illustrates an exemplary embodiment of the present invention in which a prospective signal is relocated to provide sufficient bandwidth separation from an existing frequency signal to avoid frequency pulling in accordance with the invention. An existing signal 312 operates at a frequency point $F_{E1}$, the existing signal frequency having a predefined pulling bandwidth 320 associated therewith. Subsequently, a request is received to tune a prospective signal 322 to a first prospective frequency point $F_{P1}$, the first frequency point $F_{P1}$ within the pulling bandwidth 320 of the existing frequency. As noted above, the pulling bandwidth will generally be dependent upon the Q-factor of the frequency source, and the isolation between it and the frequency source generating the proximate signal. In one embodiment all of the frequency sources exhibit substantially the same Q-factor and isolation, and accordingly each frequency source will have substantially the same pulling bandwidth. In another embodiment of the invention, the Q-factor and isolation is different for one or more of the frequency sources, and accordingly the pulling bandwidth will be determined once the tuning (second) frequency source is identified.

Upon receiving the request to tune to the first prospective frequency point $F_{P1}$, but before signal generation or tuning thereto, a determination is made (214) as to whether $F_{P1}$ is within the pulling bandwidth 320 of the existing signal 312. In the illustrated example, $F_{P1}$ lies within the pulling bandwidth 320, and the aforementioned process continues at 216 where a determination is made as to whether the existing signal 312 is generated by a tunable frequency source. In the present case for purposes of illustration, the existing signal 312 is determined to be generated by a fixed frequency source. In such an instance, the tuning process continues at 218, where the prospective signal is relocated away from the first frequency point $F_{P1}$ in a non-crossing manner to a second prospective frequency point $F_{P2}$. The tuning operation at 218 further includes determinating that $F_{P2}$ is outside of the pulling bandwidth 320 of the existing signal 312. The process continues at 222 where the prospective signal 322 is generated at the second prospective frequency point $F_{P2}$. Alternatively, the process at 218 may be made iterative, whereby the prospective signal is gradually stepped away from the existing signal frequency in one or more steps.

In an alternative embodiment in which the existing frequency source is tunable, the relocation distance of each frequency would be less, as the combined effect of relocating the existing signal 312 slightly above $F_{E1}$ (with the accompanying movement of the pulling bandwidth 320 also slightly higher in frequency) and moving the prospective signal 322 slightly below $F_{T1}$ results in achieving the required bandwidth separation with comparably smaller frequency shifts. In an exemplary embodiment of such a system, tunable systems such as the sigma-delta phase locked loop can be used as the frequency source for generating the existing and prospective signals. Further exemplary, the existing frequency is iteratively tuned away from the prospective signal in two or more steps to reduce frequency overshoot effects which could accompany the signal's relocation to its final frequency.

It is to be noted that in embodiments of the invention in which the prospective and or existing signals are relocated, the frequency source may continue generating its signal during the signal's relocation to a new frequency point. Alternatively, the frequency source can be deactivated, configured to tune to the new frequency (e.g. a higher frequency), and activate its signal at the new frequency point.

As readily appreciated by those skilled in the art, the described processes may be implemented in hardware, software, firmware or a combination of these implementations as appropriate. In addition, some or all of the described processes may be implemented as computer readable instruction code resident on a computer readable medium (removable disk, volatile or non-volatile memory, embedded processors, etc.), the instruction code operable to program a computer of other such programmable device to carry out the intended functions.

The terms "a" or "an" are used to refer to one, or more than one feature described thereby. Furthermore, the term "coupled" or "connected" refers to features which are in communication with each other (electrically, mechanically, thermally, as the case may be), either directly, or via one or more intervening structures or substances. The sequence of operations and actions referred to in method flowcharts are exemplary, and the operations and actions may be conducted in a different sequence, as well as two or more of the operations and actions conducted concurrently. All publications, patents, and other documents referred to herein are incorporated by reference in their entirety. To the extent of any inconsistent usage between any such incorporated document and this document, usage in this document shall control.

The foregoing description has been presented for purposes of illustration and description. It is not intended to be exhaustive or to limit the invention to the precise form disclosed, and obviously many modifications and variations are possible in light of the disclosed teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method for mitigating phase pulling in multiple frequency source system, the method comprising:
   generating a first signal comprising an existing signal at an existing frequency point, the existing signal having a predefined pulling bandwidth around the existing frequency point;
   receiving a request to generate a prospective signal at a prospective frequency point within the predefined pulling bandwidth of the existing signal;
   removing the prospective frequency point from within the predefined pulling bandwidth; and
   generating the prospective signal and the existing signal at their corresponding frequency points.

2. The method of claim 1, wherein the existing signal is generated using a fixed frequency source, and wherein removing the prospective frequency point from within the predefined pulling bandwidth comprises tuning the frequency source of the prospective signal to a new prospective frequency point away from the existing signal, the new prospective frequency point located outside of the predefined pulling bandwidth of the existing signal.

3. The method of claim 1, wherein the existing signal is generated using a tunable frequency source, and wherein removing the prospective frequency point from within the predefined pulling bandwidth comprises tuning the frequency source of the existing signal to a new existing frequency point away from the prospective frequency point, whereby the prospective frequency point is located outside of the predefined pulling bandwidth of the existing signal once the existing frequency point is relocated to the new existing frequency point.

4. The method of claim 1, wherein the existing signal is generated using a tunable frequency source, and wherein removing the prospective frequency point from within the predefined pulling bandwidth comprises tuning the frequency source of the prospective signal to a new prospective frequency point away from the existing signal.

5. The method of claim 1, wherein the existing signal is generated using a tunable frequency source, and wherein removing the prospective frequency point from within the predefined pulling bandwidth comprises:
   tuning the frequency source of the prospective signal to a new prospective frequency point away from the existing frequency point; and
   tuning the frequency source of the existing signal to a new existing frequency point away from the prospective frequency point.

6. The method of claim 5,
   wherein tuning the frequency source of the prospective signal comprises controlling a first phase locked loop to generate the prospective signal at the new prospective frequency point; and
   wherein tuning the frequency source of the existing signal comprises controlling a second phase locked loop to generate the existing signal at the new existing frequency point.

7. A method for mitigating phase pulling in multiple frequency source system, the method comprising:
   generating a first signal comprising an existing signal at an existing frequency point, the existing signal having a predefined pulling bandwidth around the existing frequency point;
   receiving a request to generate a prospective signal at a prospective frequency point within the predefined pulling bandwidth of the existing signal;
   removing the prospective frequency point from within the predefined pulling bandwidth, comprising:
      tuning the prospective signal to a new prospective frequency point in a direction away from the existing signal; and
      tuning the existing signal to a new existing signal frequency point in a direction away from the prospective signal; and
   generating the prospective signal and the existing signal at their corresponding new frequency points.

8. The method of claim 7,
   wherein tuning the prospective signal to a new prospective frequency point comprises controlling a first phase locked loop to generate the prospective signal at the new prospective frequency point; and
   wherein tuning the existing signal to a new existing frequency point comprises controlling a second phase locked loop to generate the existing signal at the new existing frequency point.

9. A system for mitigating phase pulling in multiple frequency source system, the system comprising:
   means for generating a first signal comprising an existing signal at an existing frequency point, the existing signal having a predefined pulling bandwidth around the existing frequency point;
   means for receiving a request to generate a prospective signal at a prospective frequency point within the predefined pulling bandwidth of the existing signal;
   means for removing the prospective frequency point from within the predefined pulling bandwidth; and
   means for generating the prospective signal and the existing signal at their corresponding frequency points.

10. The system of claim 9, wherein the means for generating a first frequency comprises a fixed frequency source, and wherein the means for removing the prospective frequency point from within the predefined pulling bandwidth comprises means for tuning the frequency source of the prospective signal to a new prospective frequency point away from the existing signal, the new prospective frequency point located outside of the predefined pulling bandwidth of the existing signal.

11. The system of claim 9, wherein the means for generating a first frequency comprises a tunable frequency source, and wherein the means for removing the prospective frequency point from within the predefined pulling bandwidth comprises means for tuning the frequency source of the existing signal to a new existing frequency point away from the prospective frequency point, whereby the prospective frequency point is located outside of the predefined pulling bandwidth of the existing signal once the existing frequency point is relocated to the new existing frequency point.

12. The system of claim 9, wherein the means for generating a first frequency comprises a tunable frequency source, and wherein the means for removing the prospective frequency point from within the predefined pulling bandwidth comprises means for tuning the frequency source of the prospective signal to a new prospective frequency point away from the existing signal.

13. The system of claim 9, wherein the means for generating a first frequency comprises a tunable frequency source, and wherein the means for removing the prospective frequency point from within the predefined pulling bandwidth comprises:
   means for tuning the frequency source of the prospective signal to a new prospective frequency point away from the existing frequency point; and
   means for tuning the frequency source of the existing signal to a new existing frequency point away from the prospective frequency point.

14. The system of claim 13,
   wherein the means for tuning the frequency source of the prospective signal comprises a first phase locked loop operable to generate the prospective signal at the new prospective frequency point; and
   wherein the means for tuning the frequency source of the existing signal comprises a second phase locked loop operable to generate the existing signal at the new existing frequency point.

15. A computer program product, resident on a computer readable medium, and operable to control a programmable system to mitigate phase pulling in multiple frequency source system, the computer program product comprising:
   instruction code to generate a first signal comprising an existing signal at an existing frequency point, the existing signal having a predefined pulling bandwidth around the existing frequency point;

instruction code to receive a request to generate a prospective signal at a prospective frequency point within the predefined pulling bandwidth of the existing signal;

instruction code to remove the prospective frequency point from within the predefined pulling bandwidth; and instruction code to generate the prospective signal and the existing signal at their corresponding frequency points.

16. The computer program product of claim 15, wherein the existing signal is generated using a fixed frequency source, and wherein the instruction code to remove the prospective frequency point from within the predefined pulling bandwidth comprises instruction code to tune the frequency source of the prospective signal to a new prospective frequency point away from the existing signal, the new prospective frequency point located outside of the predefined pulling bandwidth of the existing signal.

17. The computer program product of claim 15, wherein the existing signal is generated using a tunable frequency source, and wherein the instruction code to remove the prospective frequency point from within the predefined pulling bandwidth comprises instruction code to tune the frequency source of the existing signal to a new existing frequency point away from the prospective frequency point, whereby the prospective frequency point is located outside of the predefined pulling bandwidth of the existing signal once the existing frequency point is relocated to the new existing frequency point.

18. The computer program product of claim 15, wherein the existing signal is generated using a tunable frequency source, and wherein instruction code to remove the prospective frequency point from within the predefined pulling bandwidth comprises instruction code to tune the frequency source of the prospective signal to a new prospective frequency point away from the existing signal.

19. The computer program product of claim 15, wherein the existing signal is generated using a tunable frequency source, and wherein instruction code to remove the prospective frequency point from within the predefined pulling bandwidth comprises:

instruction code to tune the frequency source of the prospective signal to a new prospective frequency point away from the existing frequency point; and instruction code to tune the frequency source of the existing signal to a new existing frequency point away from the prospective frequency point.

20. The computer program product of claim 19, wherein the instruction code to tune the frequency source of the prospective signal comprises instruction code to control a first phase locked loop to generate the prospective signal at the new prospective frequency point; and wherein the instruction code to tune the frequency source of the existing signal comprises instruction code to control a second phase locked loop to generate the existing signal at the new existing frequency point.

* * * * *